United States Patent [19]

Kitamura et al.

[11] Patent Number: 5,705,842
[45] Date of Patent: Jan. 6, 1998

[54] HORIZONTAL MOSFET

[75] Inventors: Akio Kitamura; Naoto Fujishima, both of Nagano, Japan

[73] Assignee: Fuji Electric Co., Ltd., Japan

[21] Appl. No.: 813,102

[22] Filed: Mar. 7, 1997

Related U.S. Application Data

[63] Continuation of Ser. No. 396,146, Mar. 1, 1995, abandoned.

[30] Foreign Application Priority Data

Mar. 8, 1994 [JP] Japan .................. 6-036234

[51] Int. Cl.⁶ .................. H01L 29/78; H01L 29/10; H01L 29/784
[52] U.S. Cl. .................. 257/362; 257/335; 257/473; 257/144.9; 257/343; 257/358; 257/360; 257/361; 257/363; 257/373; 257/379; 257/281
[58] Field of Search .................. 357/408, 362, 357/336, 328, 335, 548, 549, 550, 544, 476, 481, 122, 141, 473, 449, 250, 281, 343, 358, 360, 361, 363, 367, 373, 379

[56] References Cited

U.S. PATENT DOCUMENTS

| | | | |
|---|---|---|---|
| 4,992,844 | 2/1991 | Yakushiji | 257/379 |
| 5,077,586 | 12/1991 | Quessada | 257/485 |
| 5,208,471 | 5/1993 | Mori et al. | 257/328 |
| 5,284,981 | 2/1994 | Lilja et al. | 257/133 |
| 5,338,964 | 8/1994 | Bernier | 257/476 |
| 5,357,120 | 10/1994 | Mori | 257/141 |
| 5,432,370 | 7/1995 | Kitamura et al. | 257/337 |

FOREIGN PATENT DOCUMENTS 6-120510  4/1994  Japan.

*Primary Examiner*—Tom Thomas
*Assistant Examiner*—Alexander Oscar Williams
*Attorney, Agent, or Firm*—Rossi & Associates

[57] ABSTRACT

A horizontal MOSFET prevents itself from breakdown caused by an avalanche current which flows to a base of a parasitic bipolar transistor when avalanche breakdown of a diode formed between a drain and a substrate occurs. A current path, comprised of a back electrode or a layer with high impurity concentration, is disposed on the side of a back surface of a semiconductor substrate. This current path reduces the base current of the parasitic transistor. Due to this, heat generation caused by an operation of the parasitic transistor is suppressed, and the avalanche withstand capability of the MOSFET is improved corresponding to reduction of the internal resistance component of the MOSFET.

12 Claims, 4 Drawing Sheets

HORIZONTAL MOSFET

This is a Continuation of application Ser. No. 08/396,146 filed Mar. 1, 1995, now abandoned.

FIELD OF THE INVENTION

The present invention relates to a horizontal MOSFET with high withstand voltage which is integrated, for example, into a one-chip power integrated circuit (IC) used in power supplies.

BACKGROUND OF THE INVENTION

MOSFETs with high withstand voltage are used in a circuit which drives an inductive load such as a switching power supply circuit etc. When the MOSFET is switched off, high voltage, generated by counter-electromotive force of the inductive load, is applied to the MOSFET. Conventional MOSFETs have therefore been required to have withstand voltage higher than the applied high voltage generated by the counter-electromotive force. Since a trade-off relationship exists between the withstand voltage and the ON-resistance of the MOSFET, a higher withstand voltage inevitably causes a higher ON-resistance if the size of the MOSFET is not enlarged. If one wants to realize higher withstand voltage while preventing the ON-resistance of the MOSFET from increasing, the size of the MOSFET must be enlarged and cost of the MOSFET increases. To avoid this trade-off relationship, a new concept, which gives priority to avalanche withstand capability, has been proposed. According to this concept, the withstand voltage of the MOSFET is set at a lower value to lower the ON-resistance, and the MOSFET is prevented from breakdown by absorbing in the MOSFET the energy associated with voltage higher than the withstand voltage of the MOSFET. The avalanche withstand capability is expressed by an ON-current value which the MOSFET can interrupt without causing its breakdown while the MOSFET, connected to an inductive load of 100 μH, is being switched from ON state to OFF state.

The horizontal power MOSFET is advantageous for constituting power ICs, since all the main electrodes of power MOSFET can be formed on a surface of a substrate, and it is easily integrated with a low voltage control circuit on a semiconductor substrate. FIG. 2 shows a typical structure of a horizontal n-channel MOSFET. In FIG. 2, an n-type well 2 is formed in a surface layer of a p⁻ silicon substrate 1. Inside the n-type well 2, first p-type base regions 3, 3 are formed and a second p-type base region 4, as described in Japanese Patent Application No. H04-309920, if formed in connection with one of the first p-type base regions 3. In each first p-type base region 3, an n⁺ source region 5 and a deep p+ region 31 are formed. A channel is to be formed in a region of the p-type base region 3 sandwiched by the n⁺ source region 5 and the exposed part of the n-type well 2. On this channel formation region, a gate electrode 7 is formed through gate oxide film 6. An n⁺ type drain region 8 is formed on the right hand side of the second p-type base region 4. A p-type deep well (DP well) 9 is formed by impurity diffusion from a part of the surface of the n⁺ type drain region 8 on the side of the p⁻ substrate 1 of the n⁺ type drain region 8. A p⁺ pickup region 10 is formed for connecting the p⁻ substrate 1 to outside elements. On the configuration described above (hereinafter sometimes referred to as "device"), a source electrode 11, insulated from the date electrode 7 by insulation film 16, is formed in contact commonly with the n⁺ source regions 5, 5, and the deep p⁺ regions 31, 31, a drain electrode 12 in contact with the n⁺ type drain region 8, and a substrate electrode 13 in contact with the p⁺ pickup region 10. The DP well 9 and the n⁺ type drain region 8 form a breakdown diode 20 which prevents the withstand voltage from deteriorating with age caused by high voltage applied to the drain electrode 12. In the horizontal n-channel MOSFET of FIG. 2, when avalanche breakdown occurs between the p⁻ substrate 1 and the n⁺ type drain region 8 around the breakdown diode 20, many electron-hole pairs are generated in the area where the avalanche breakdown has occurred. The generated electrons are absorbed into the drain electrode 12 from the n⁺ type drain region 8.

Two paths may be considered for the generated holes: a path 21 from the p⁻ substrate 1 to the substrate electrode 13 through the substrate pickup region 10 formed in a periphery of the device, and a path 22 from the p⁻ substrate 1 to the source electrode 11 through the p-type base regions 3, 3. FIG. 3 shows an equivalent circuit which includes these paths. A parasitic NPN transistor 24, comprised of the n-type well 2, the p-type base regions 3, 3, and the n⁺ source regions 5, 5, is connected between the drain electrode 12 and the source electrode 11 in parallel with a main MOSFET 23. A base current of the transistor 24 changes with the ratio of resistance $R_1$ of the path 21 and resistance $R_2$ of the path 22. Since the resistance $R_1$ of the path 21 is high in the configuration according to the prior art, the base current of the transistor 24 is large. Because of this, the device is broken down by the operation of the parasitic transistor 24 and by the associated current concentration and heat generation. The following three breakdown factors may govern the reliability of horizontal transistors:

(1) heat generation associated with the operation of the parasitic transistor;

(2) heat generation solely associated with avalanche breakdown; and (3) heat generation from resistive components in the device.

Since avalanche breakdown capability is evaluated by a current which a device connected with an inductive load can interrupt, the avalanche breakdown capability includes all the factors described above.

In view of the foregoing, it is an object of the present invention is to provide a horizontal MOSFET that improves avalanche withstand capability by preventing the parasitic transistor from operating and the resistive components in the device from generating heat which are most likely to cause breakdown of the horizontal MOSFET.

SUMMARY OF THE INVENTION

The object of the present invention is achieved by a horizontal MOSFET which is comprised of a semiconductor substrate of a first conductivity type; a well region of a second conductivity type formed from the first surface of the semiconductor substrate; base regions of the first conductivity type formed on the first side in surface layers of the well region; a drain region of the second conductivity type formed on the second side of a surface layer of the well region; source regions of the second conductivity type selectively formed in a surface layer of the base regions; a gate electrode disposed through gate oxide film on a surface of a region extending from the source regions to an exposed surface area of the well region; a drain electrode contacting with the drain electrode; a source electrode contacting commonly with the source regions and the base regions; a substrate electrode contacting with an exposed area of the semiconductor substrate exposed on the side of the source electrode far from the drain electrode; and a current path of low resistance formed on the side of the second surface of the semiconductor substrate. The current path is preferably comprised of an electrode layer which is in ohmic contact with the second surface of the semiconductor substrate, an electrode layer which forms a Schottky junction with the second surface of the semiconductor substrate, or a layer with high impurity concentration formed in a surface layer of the second surface of the semiconductor substrate. The thickness of the semiconductor substrate is preferably set at 350 μm or less. Alternatively, it is preferable to set the resistivity of the substrate layer at 200 Ωcm or more, and its thickness thin enough to induce punch through by application of voltage corresponding to reverse withstand voltage required to a PN junction between the drain region and the semiconductor substrate.

By forming a current path with low resistance, the resistance between the drain electrode and the substrate electrode is lowered and the parasitic transistor is prevented from operating. Due to this, the energy consumed by the resistance is reduced and the avalanche withstand capability is improved. By contacting the electrode disposed as the current path on the second surface of the substrate in Schottky contact with the substrate, the minority carriers are injected from the electrode into the substrate when the avalanche current is generated. Since the minority carrier injection modulates the conductivity of the substrate, the avalanche withstand capability is further improved. When reverse bias corresponding to the withstand voltage between the drain region and the substrate is applied, a depletion layer reaches the electrode disposed on the second surface of the substrate to induce punch through. Since the resistance of the depletion layer is very low, the resistance between the drain region and the substrate is lowered almost to zero, and, by virtue of this, the avalanche withstand capability is greatly improved.

BRIEF DESCRIPTION OF THE DRAWINGS

The invention will be described in greater detail with reference to certain preferred embodiments thereof in conjunction with the accompany drawings, wherein.

DETAILED DESCRIPTION OF THE PREFERRED EMBODIMENTS

Figure 1:
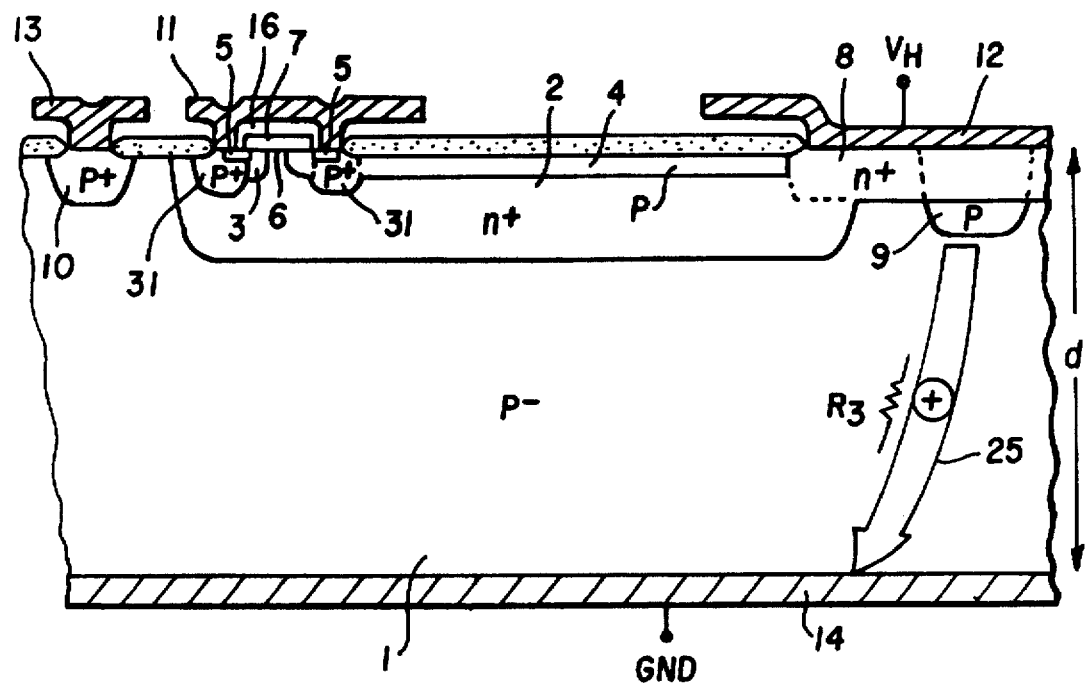
FIG. 1 is a sectional view showing the first and the second embodiments of a horizontal MOSFET according to the present invention.
Figure 2:
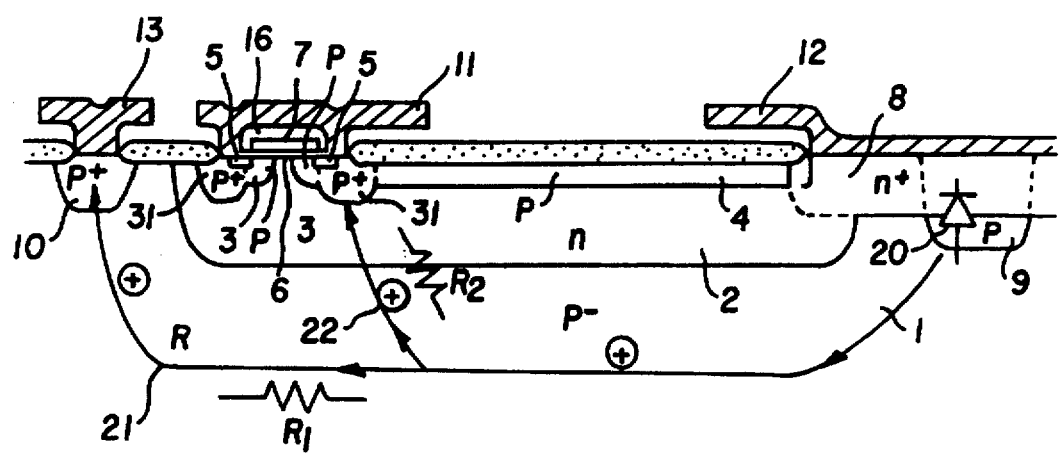
FIG. 2 is a sectional view showing a horizontal MOSFET according to the prior art.
Figure 3:
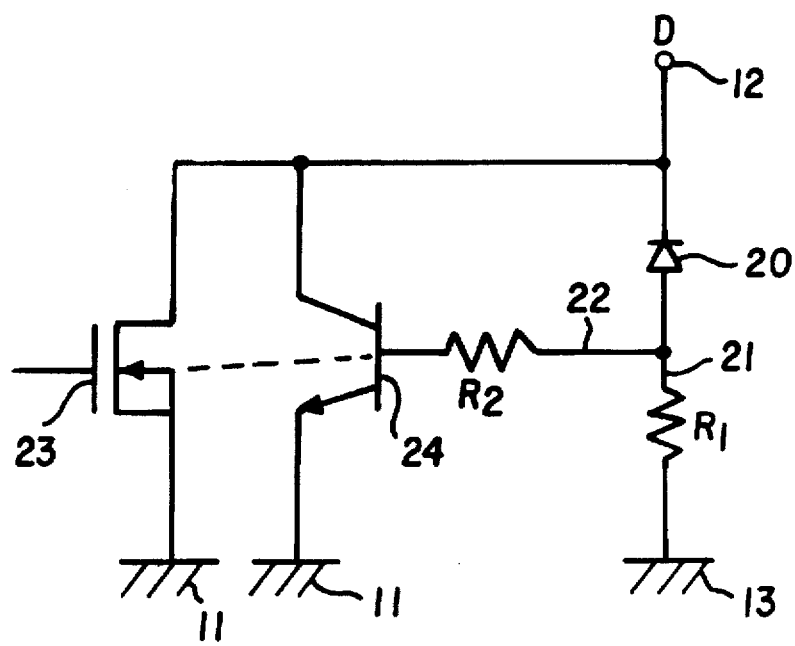
FIG. 3 is a diagram showing an equivalent circuit of FIG. 2.

Now the present invention will be described in detail hereinafter with accompanied drawing figures which illustrate the preferred embodiments of the present invention. Throughout the drawing figures, same parts are designated by the same reference numerals.

Figure 4:
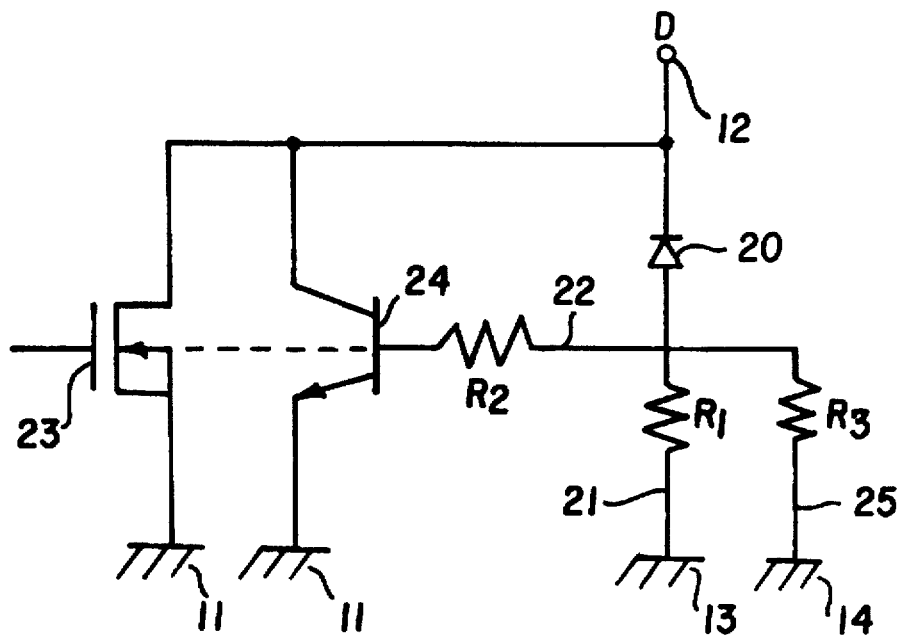
FIG. 4 is a diagram showing an equivalent circuit of the embodiments of the present invention.

In the first embodiment of an n-channel MOSFET according to the present invention shown in FIG. 1, an n-type well 2 with surface impurity concentration of about $2\times10^{16}$cm$^{-3}$, an n$^+$ type drain region 8 with surface impurity concentration of about $2\times10^{17}$cm$^{-3}$, and a DP well 9 with surface impurity concentration of about $8\times10^5$cm$^{-3}$ are formed in a surface layer of a p$^-$ silicon substrate 1, refined by the floating zone (FZ) method, with specific resistance of around 140 Ωcm and thickness d of 500 μm. A pair of n+ source regions 5, 5, a pair of the first p-type base regions 3, 3 with surface impurity concentration of about $6\times10^{17}$cm$^{-3}$, and the second p-type base region 4 are formed in the n-type well 2. A gate electrode 7 is formed on the surfaces of the n$^+$ source regions 5, 5, and the p-type base regions 3, 3 through gate oxide film 6. A back electrode 14, which is in ohmic contact with the p$^-$ silicon substrate 1, is formed on a back surface of the substrate 1. The back electrode 14 is grounded. An equivalent circuit of the above described configuration (device) is shown FIG. 4. A current path 25, along which an avalanche current flows to the back electrode 14, is formed in the equivalent circuit of FIG. 4. Resistance $R_3$ of the current path 25 is smaller than $R_1$ and $R_2$ defined earlier.

Since the avalanche current flows mainly through the path 25 and the current flow through the path 21 decreases in the device structure described above, the base current (hole current) of the parasitic transistor 24 decreases. By virtue of this mechanism, the parasitic transistor 24 is prevented from operating. In addition, the avalanche withstand capability is improved, since the energy consumed by the resistive components $R_1$, $R_2$ and $R_3$ decreases. Though the withstand voltage is about 700 V and the ON-resistance per unit area is around 0.55 Ωcm$^2$ in this device, an additional 200 V is required to the withstand voltage when the avalanche withstand capability is not secured. Since the withstand voltage and the ON-resistance per unit area are proportional to 2.4 to 2.7 times the breakdown voltage across the source and the drain, the ON-resistance is reduced by about 45%. Since this corresponds to 45% reduction of the device area for the required ON-resistance, the number of devices formed on a semiconductor wafer is theoretically increased by about 19%. The reduction of the device area improves yield of non-defective devices thereby reducing costs.

In the second embodiment of an n-channel MOSFET according to the present invention, the back surface of the substrate 1 is lapped back to the substrate thickness of 350 μm or less, for example 300 μm. By adopting a thinner substrate, $R_3$ is further decreased, and by which the avalanche withstand capability is further improved.

Figure 5:
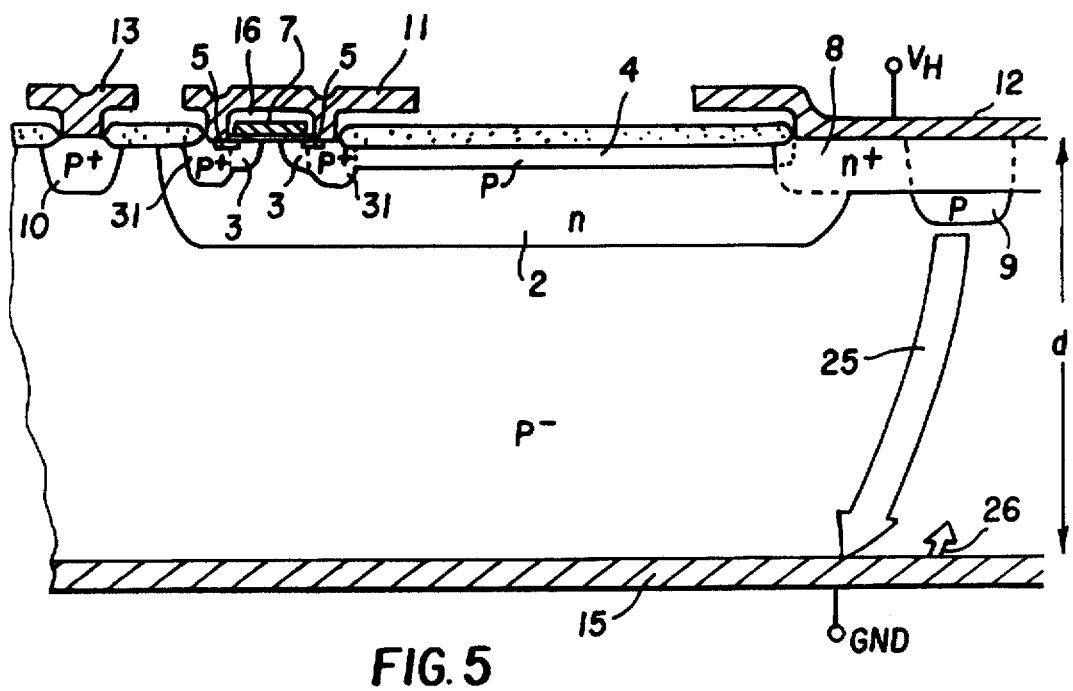
FIG. 5 is a sectional view showing the third and the fourth embodiments of a horizontal MOSFET according to the present invention.

In the third embodiment shown in FIG. 5, a back electrode 15 is in Schottky contact with the p$^-$ substrate 1 and grounded. When a hole current, generated by breakdown caused by high voltage HV applied the drain electrode 12, is absorbed into the back electrode 15, a small current (minority carriers) 26 is injected from the back electrode 15 to the p$^-$ substrate 1. By this minority carrier injection, the conductivity of the p$^-$ substrate 1 is modulated and lowered. That is, $R_3$ is further reduced than by the first embodiment, and the avalanche withstand capability is further increased. Since the electron flow injected into the p$^-$ substrate 1 is very small, other devices on the semiconductor substrate such as a control circuit etc. is not affected by the electron injection.

The fourth embodiment increases the avalanche withstand capability by lapping back the back surface of the substrate 1 of FIG. 5 to the thickness of 300 μm as in the second embodiment.

Figure 6:
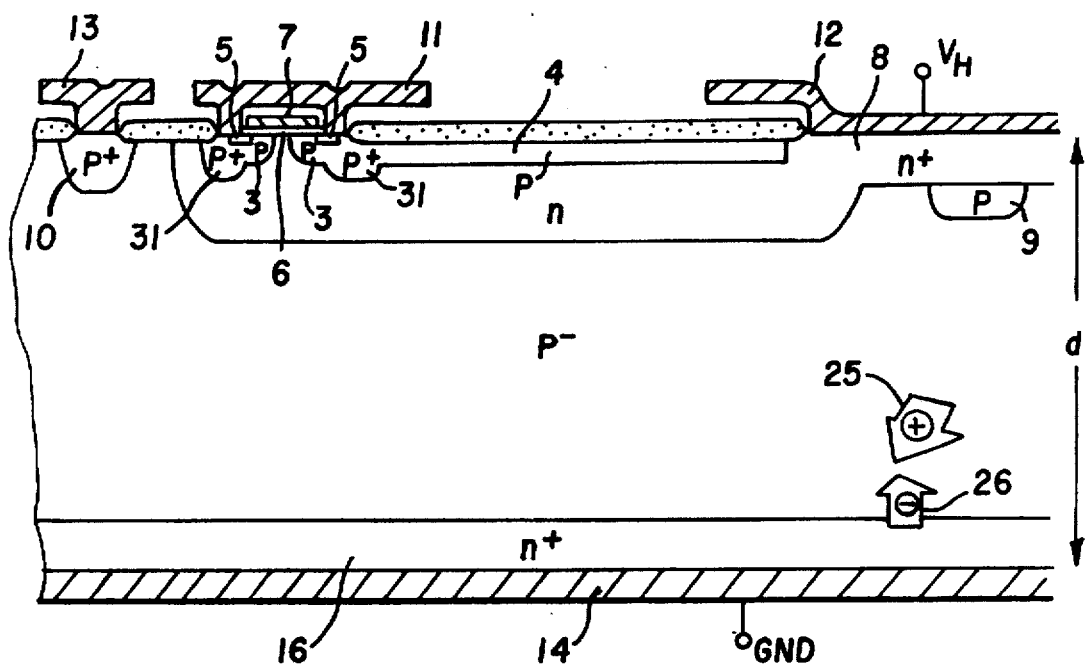
FIG. 6 is a sectional view showing the fifth and the sixth embodiments of a horizontal MOSFET according to the present invention.

In the fifth embodiment of a horizontal MOSFET shown in FIG. 6, the back electrode 14 contacts with the surface of an n+ layer 16 formed on the back surface of the p− substrate 1. A parasitic NPN transistor is formed which is comprised of an emitter, a base, and a collector, which are further comprised respectively of the n+ layer 16, the DP well 9, and the n+ type drain region 8. This parasitic NPN transistor is switched off in a normal state in which the carrier injection does not occur, since the n+ layer 16 as the emitter and the p− substrate 1 as the base are grounded. In an abnormal state, the high voltage HV applied to the drain of the MOSFET triggers avalanche current generation in the breakdown diode 20 and hole injection into the substrate 1. In association with the hole injection, a base current is generated in the parasitic transistor and the conductivity of the p− substrate 1 is so modulated as to further reduce $R_3$ greatly. Thus, the avalanche withstand capability is increased.

The sixth embodiment increases the avalanche withstand capability by lapping back the back surface of the substrate 1 of FIG. 6 to the thickness of 300 μm. In the fifth and the sixth embodiments, the back electrode 14 may be omitted.

Figure 7:
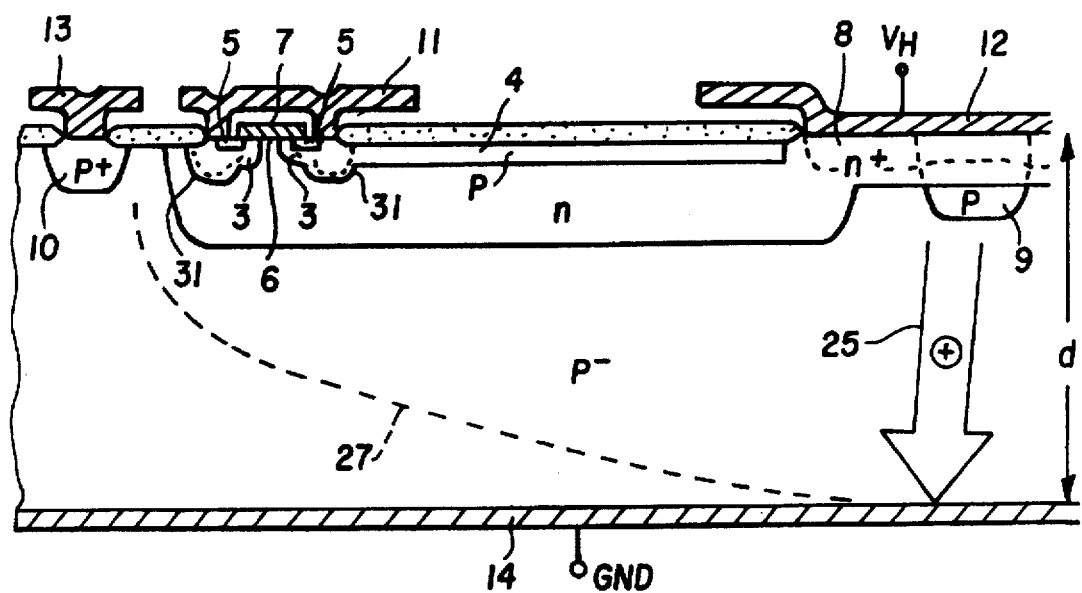
FIG. 7 is a sectional view showing the seventh embodiment of a horizontal MOSFET according to the present invention.

In the seventh embodiment of a horizontal MOSFET shown in FIG. 7, the specific resistance of the p− substrate is set at 400 Ωcm and the thickness at 150 Ωm. When reverse bias is applied, a depletion region expands from the breakdown diode 20 between the n-type region 8 and the DP well 9. The edge 27 of the depletion layer reaches the back electrode 14 when VH of about 900 V is applied to the drain electrode 12. As soon as the edge 27 of the depletion layer reaches the back electrode 14, a current flows between the drain electrode 12 and the back electrode 14 and the voltage between the these electrodes is clamped. This phenomenon is called a punch through phenomenon. The punch through voltage determines the withstand voltage of the device. Since the resistance of the depletion layer is very low, $R_3$ is reduced almost to 0Ω when the punch through has occurred. Therefore, the withstand capability is greatly increased.

It is quite obvious that the present invention is applicable also to the horizontal MOSFETs which lack the second p-type base region 4 or the DP well 9.

As explained above, the avalanche withstand capability of the MOSFET is improved by the present invention which reduces the base current of the parasitic transistor to prevents the MOSFET from breakdown by forming in back surface of the substrate a current path of low resistance through which an avalanche current flows when avalanche breakdown is caused by reverse bias in a diode formed between the drain region and the substrate of the horizontal MOSFET. Therefore, ON-resistance of the MOSFET is further lowered, since the withstand voltage of the device can be set at a lower value.

What is claimed is:

1. A horizontal MOSFET comprising:

a semiconductor substrate of a first conductivity type;

a well region of a second conductivity type formed from a first surface of the semiconductor substrate;

base regions of the first conductivity type formed on a first side in a surface layer of the well region;

a drain region of the second conductivity type formed on a second side of the surface layer of the well region;

source regions of the second conductivity type selectively formed in surface layers of the base regions;

a gate electrode disposed on a gate oxide film located on a surface of a region extending from the source regions to an exposed surface area of the well region;

a drain electrode contacting with the drain region;

a source electrode contacting commonly with the source regions and the base regions;

a substrate electrode contacting with an exposed area of the semiconductor substrate exposed on a side of the source electrode far from the drain electrode and outside of the well region; and a current path of low resistance, including an electrode layer formed on a side of a second surface of the semiconductor substrate, through which an avalanche current flows, thereby increasing a breakdown characteristic of the horizontal MOSFET.

2. The horizontal MOSFET as claimed in claim 1, wherein the electrode layer is in ohmic contact with the second surface of the semiconductor substrate.

3. The horizontal MOSFET as claimed in claim 1, wherein the electrode layer forms a Schottky junction with the second surface of the semiconductor substrate.

4. A horizontal MOSFET comprising:

a semiconductor substrate of a first conductivity type;

a well region of a second conductivity type formed from a first surface of the semiconductor substrate;

base regions of the first conductivity type formed on a first side in a surface layer of the well region;

a drain region of the second conductivity type formed on a second side of the surface layer of the well region;

source regions of the second conductivity type selectively formed in surface layers of the base regions;

a gate electrode disposed through gate oxide film on a surface of a region extending from the source regions to an exposed surface area of the well region;

a drain electrode contacting with the drain region;

a source electrode contacting commonly with the source regions and the base regions;

a substrate electrode contacting with an exposed area of the semiconductor substrate exposed on a side of the source electrode far from the drain electrode; and a current path of low resistance formed on a side of a second surface of the semiconductor substrate;

wherein the current path comprises a layer with high impurity concentration formed in a surface layer of the second surface of the semiconductor substrate.

5. The horizontal MOSFET as claimed claim 1, wherein the semiconductor substrate is 350 μm or less in thickness.

6. The horizontal MOSFET as claimed claim 2, wherein the semiconductor substrate is 350 μm or less in thickness.

7. The horizontal MOSFET as claimed claim 3, wherein the semiconductor substrate is 350 μm or less in thickness.

8. The horizontal MOSFET as claimed claim 4, wherein the semiconductor substrate is 350 μm or less in thickness.

9. A horizontal MOSFET comprising:

a semiconductor substrate of a first conductivity type;

a well region of a second conductivity type formed from a first surface of the semiconductor substrate;

base regions of the first conductivity type formed on a first side in a surface layer of the well region;

a drain region of the second conductivity type formed on a second side of the surface layer of the well region;

source regions of the second conductivity type selectively formed in surface layers of the base regions;

a gate electrode disposed through gate oxide film on a surface of a region extending from the source regions to an exposed surface area of the well region;

a drain electrode contacting with the drain region;

a source electrode contacting commonly with the source regions and the base regions;

a substrate electrode contacting with an exposed area of the semiconductor substrate exposed on a side of the source electrode far from the drain electrode; and a current path of low resistance formed on a side of a second surface of the semiconductor substrate;

wherein the current path comprises an electrode layer which is in ohmic contact with the second surface of the semiconductor substrate; and wherein resistivity of the semiconductor substrate is 200 $\Omega$cm or more, and a thickness thereof is thin enough to induce punch through by application of voltage corresponding to a reverse withstand voltage required for a PN junction between the drain region and the semiconductor substrate.

10. The horizontal MOSFET as claimed in claim 9, wherein the semiconductor substrate is 350 μm or less in thickness.

11. A horizontal MOSFET comprising:

a semiconductor substrate of a first conductivity type;

a well region of a second conductivity type formed from a first surface of the semiconductor substrate;

base regions of the first conductivity type formed on a first side in a surface layer of the well region;

a drain region of the second conductivity type formed on a second side of the surface layer of the well region;

source regions of the second conductivity type selectively formed in surface layers of the base regions;

a gate electrode disposed through gate oxide film on a surface of a region extending from the source regions to an exposed surface area of the well region;

a drain electrode contacting with the drain region;

a source electrode contacting commonly with the source regions and the base regions;

a substrate electrode contacting with an exposed area of the semiconductor substrate exposed on a side of the source electrode far from the drain electrode; and a current path of low resistance formed on a side of a second surface of the semiconductor substrate;

wherein the current path comprises an electrode layer which forms a Schottky junction with the second surface of the semiconductor substrate; and wherein resistivity of the semiconductor substrate is 200 $\Omega$cm or more, and a thickness thereof is thin enough to induce punch through by application of voltage corresponding to a reverse withstand voltage required for a PN junction between the drain region and the semiconductor substrate.

12. The horizontal MOSFET as claimed in claim 11, wherein the semiconductor substrate is 350 μm or less in thickness.

\* \* \* \* \*